United States Patent
Seler et al.

(10) Patent No.: US 11,658,135 B2
(45) Date of Patent: May 23, 2023

(54) SEMICONDUCTOR DEVICES COMPRISING A RADAR SEMICONDUCTOR CHIP AND ASSOCIATED PRODUCTION METHODS

(71) Applicant: Infineon Technologies AG, Neubiberg (DE)

(72) Inventors: Ernst Seler, Munich (DE); Markus Josef Lang, Pfarrkirchen (AT); Maciej Wojnowski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 312 days.

(21) Appl. No.: 16/747,971

(22) Filed: Jan. 21, 2020

(65) Prior Publication Data
US 2020/0251430 A1  Aug. 6, 2020

(30) Foreign Application Priority Data
Feb. 5, 2019  (DE) .......................... 102019102784.5

(51) Int. Cl.
| H01L 23/66 | (2006.01) |
| H01L 23/00 | (2006.01) |
| H01L 23/498 | (2006.01) |
| H01Q 1/22 | (2006.01) |
| G01S 13/08 | (2006.01) |
| G01S 13/931 | (2020.01) |

(52) U.S. Cl.
CPC .............. *H01L 23/66* (2013.01); *G01S 13/08* (2013.01); *H01L 23/49816* (2013.01); *H01L 24/16* (2013.01); *H01Q 1/2283* (2013.01); *G01S 13/931* (2013.01); *H01L 2223/6622* (2013.01); *H01L 2223/6633* (2013.01); *H01L 2223/6677* (2013.01); *H01L 2224/16225* (2013.01)

(58) Field of Classification Search
CPC ... H01L 23/66; H01L 23/49816; H01L 24/16; G01S 13/08
See application file for complete search history.

(56) References Cited

U.S. PATENT DOCUMENTS

| 2005/0225481 | A1* | 10/2005 | Bonthron | ............. | G01S 13/282 |
| | | | | | 342/175 |
| 2009/0251362 | A1* | 10/2009 | Margomenos | ........ | G01S 13/931 |
| | | | | | 342/175 |
| 2011/0163919 | A1 | 7/2011 | Suzuki | | |
| 2014/0110841 | A1* | 4/2014 | Beer | ................ | H01L 23/49816 |
| | | | | | 257/738 |
| 2015/0346322 | A1* | 12/2015 | Schmalenberg | ........ | G01S 13/02 |
| | | | | | 342/175 |
| 2016/0276729 | A1* | 9/2016 | Dang | ..................... | H01P 5/107 |
| 2019/0348746 | A1* | 11/2019 | Gupta | .............. | H01L 23/49838 |

FOREIGN PATENT DOCUMENTS

| DE | 102006023123 A1 | 1/2007 |
| DE | 102015112861 A1 | 2/2016 |
| EP | 3364457 A1 | 8/2018 |
| WO | 2010139366 A1 | 12/2010 |

* cited by examiner

*Primary Examiner* — Marc Anthony Armand
(74) *Attorney, Agent, or Firm* — Harrity & Harrity, LLP

(57) ABSTRACT

A semiconductor device comprises a substrate having a first surface and a second surface opposite the first surface, at least one connection element arranged on the first surface of the substrate to electrically and mechanically connect the substrate to a printed circuit board, and a radar semiconductor chip arranged on the first surface of the substrate.

20 Claims, 5 Drawing Sheets

SEMICONDUCTOR DEVICES COMPRISING A RADAR SEMICONDUCTOR CHIP AND ASSOCIATED PRODUCTION METHODS

CROSS REFERENCE TO RELATED APPLICATION

This application claims priority to German Patent Application No. 102019102784.5 filed on Feb. 5, 2019, the content of which is incorporated by reference herein in its entirety.

TECHNICAL FIELD

The present disclosure relates generally to semiconductor technology. Also, the disclosure relates to semiconductor devices comprising a radar semiconductor chip and to methods for producing such semiconductor devices.

BACKGROUND

In radar applications, signal routing and redistribution between chip and antenna may be a critical parameter with regard to the electromagnetic performance and cost-effectiveness of the application. Radar applications may comprise air-filled hollow waveguides, for example. Manufacturers of semiconductor devices endeavor to provide improved semiconductor devices and methods for producing such semiconductor devices.

SUMMARY

It may be desirable to provide cost-effective radar semiconductor devices having low performance losses and methods for the production thereof. Various aspects relate to a semiconductor device. The semiconductor device comprises a substrate having a first surface and a second surface opposite the first surface. The semiconductor device furthermore comprises at least one connection element arranged on the first surface of the substrate and serving for electrically and mechanically connecting the substrate to a printed circuit board. The semiconductor device furthermore comprises a radar semiconductor chip arranged on the first surface of the substrate.

Various aspects relate to a method for producing a semiconductor device. The method comprises arranging at least one connection element on a first surface of a substrate, wherein the at least one connection element is designed to electrically and mechanically connect the substrate to a printed circuit board. The method furthermore comprises arranging a radar semiconductor chip on the first surface of the substrate.

BRIEF DESCRIPTION OF THE DRAWINGS

Semiconductor devices comprising a radar semiconductor chip and associated production methods in accordance with the disclosure are explained in greater detail below with reference to drawings. The elements shown in the drawings are not necessarily rendered in a manner true to scale relative to one another. Identical reference signs may designate identical components.

DETAILED DESCRIPTION

In the following detailed description, reference is made to the accompanying drawings, which show for illustration purposes concrete aspects and implementations in which the disclosure can be implemented in practice. In this context, direction terms such as, for example, "at the top", "at the bottom", "at the front", "at the back", etc. may be used with respect to the orientation of the figures described. Since the components of the implementations described can be positioned in different orientations, the direction terms may be used for illustration purposes and are not restrictive in any way whatsoever. Other aspects can be used and structural or logical changes can be made, without departing from the concept of the present disclosure. That is to say that the following detailed description should not be understood in a restrictive sense.

Figure 1:
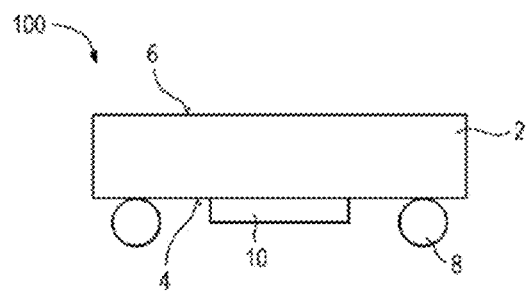
FIG. 1 schematically shows a cross-sectional side view of a semiconductor device 100 in accordance with the disclosure.

FIG. 1 schematically shows a cross-sectional side view of a semiconductor device 100 in accordance with the disclosure. The semiconductor device 100 is illustrated in a general way in order to describe aspects of the disclosure qualitatively. The semiconductor device 100 can have further aspects, which are not illustrated in FIG. 1 for the sake of simplicity. For example, the semiconductor device 100 can be extended by any desired aspects described herein in connection with other devices in accordance with the disclosure.

The semiconductor device 100 comprises a substrate 2 having a first surface 4 and a second surface 6 opposite the first surface 4. The semiconductor device 100 furthermore includes at least one connection element 8 arranged on the first surface 4 of the substrate 2 and serving for electrically and mechanically connecting the substrate 2 to a printed circuit board (not illustrated). Two connection elements 8 are shown in the example in FIG. 1. In further examples, the number of connection elements can deviate and be chosen differently in any desired manner. The connection elements 8 can be for example solder contacts in the form of solder balls or solder deposits. Furthermore, the semiconductor device 100 includes a radar semiconductor chip (or radar semiconductor die) 10 arranged on the first surface 4 of the substrate 2.

The substrate 2 can be, in particular, a ball grid array (BGA) substrate. Furthermore, the radar semiconductor chip 10 can be connected to the substrate 2 in particular using flip-chip technology. That is to say that the radar semiconductor chip 10 can be mounted without further connection wires directly with an active contacting side downward toward the substrate 2. Connection elements used for the flip-chip contacting are not explicitly illustrated in the example in FIG. 1. The substrate 2 and the radar semiconductor chip 10 can thus form in particular a flip-chip ball grid array (FCBGA).

The substrate 2 can comprise one or a plurality of layers composed of a ceramic or dielectric material. Structures for the routing and/or redistribution of electrical signals can be embedded into the layers. These signal routing structures can comprise plated-through holes and conductor tracks. The conductor tracks can be arranged on different planes between the ceramic or dielectric layers and can be electrically connected to one another by way of plated-through holes running substantially vertically with respect to the layers. In this case, the plated-through holes can extend partly, but not necessarily completely, through the substrate 2. The signal routing structures can be designed, in particular, to electrically couple the radar semiconductor chip 10 and the at least one connection element 8. Moreover, the signal routing structures can be designed very generally to produce electrical connections between electrical contact pads which can be arranged on the surfaces 4 and 6 of the substrate 2.

The radar semiconductor chip 10 can contain integrated circuits, passive electronic components, active electronic components, etc. The integrated circuits can be embodied as integrated logic circuits, analog integrated circuits, integrated mixed signal circuits, integrated power circuits, etc. The radar semiconductor chip 10 can be produced from an elemental semiconductor material (e.g. Si, etc.) or from a compound semiconductor material (e.g. GaN, SiC, SiGe, GaAs, etc.).

The radar semiconductor chip 10 can operate in a radio-frequency or microwave frequency range that can generally extend from approximately 10 GHz to approximately 300 GHz. By way of example, the radar semiconductor chip 10 can thus comprise one or a plurality of integrated radio-frequency or microwave circuits that can operate in a frequency range of greater than 10 GHz. The microwaves transmitted and/or received by the radar semiconductor chip 10 can be millimeter waves, in particular, the wavelength of which can be in the millimeter range, in particular between approximately 1 mm and approximately 10 mm, which corresponds to a frequency band of approximately 30 GHz to approximately 300 GHz. Such microwave circuits can comprise for example microwave transmitters, microwave receivers, microwave transceivers, microwave sensors, and/or microwave detectors. The devices described herein can be used for radar applications. Radar microwave devices can be used for example in automotive or industrial applications for distance determining/distance measuring systems. By way of example, automatic vehicle speed regulating systems or vehicle anticollision systems can operate in the microwave frequency range, for example at approximately 24 GHz, 77 GHz or 79 GHz.

Figure 2:
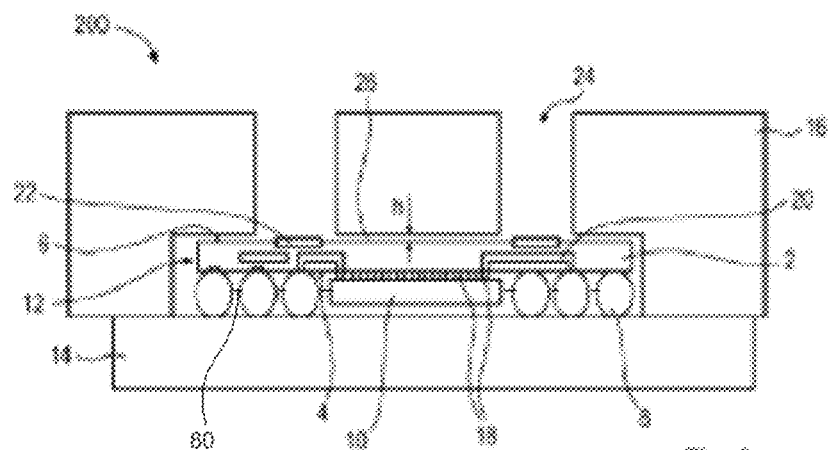
FIG. 2 schematically shows a cross-sectional side view of a semiconductor device 200 in accordance with the disclosure.

FIG. 2 schematically shows a cross-sectional side view of a semiconductor device 200 in accordance with the disclosure. The semiconductor device 200 in FIG. 2 can be regarded as a more detailed implementation of the semiconductor device 100 from FIG. 1. That is to say that the semiconductor device 100 illustrated in FIG. 1 can be extended by any desired aspects of the semiconductor device 200 in FIG. 2.

The semiconductor device 200 includes an FCBGA 12, which can be mounted on a printed circuit board 14. Furthermore, a waveguide component 16 having one or a plurality of waveguides 24 can be mounted on the printed circuit board 14. The FCBGA 12 can comprise a BGA substrate 2 having a first surface 4 and an opposite second surface 6. The substrate 2 can be mechanically and electrically connected to the printed circuit board 14 by connection elements 8 arranged on the first surface 4. A radar semiconductor chip 10 can be connected to the substrate 2 by way of further connection elements 18 using flip-chip technology. Signal routing structures 20 arranged in the substrate 2 can electrically connect the connection elements 8 to the radar semiconductor chip 10. One or a plurality of waveguiding transformer elements 22 can be arranged on the second surface 6 of the substrate 2.

An arrangement of the radar semiconductor chip 10 on the first surface 4 of the substrate 2 enables a suitable arrangement of the waveguiding transformer elements 22 on the opposite second surface 6 of the substrate 2. In particular, the arrangement of the radar semiconductor chip 10 in accordance with the present disclosure provides a maximum area for the arrangement of the waveguiding transformer elements 22 on the second surface 6 of the substrate 2.

The waveguiding transformer element 22 can be designed to feed or radiate microwave signals originally generated by the radar semiconductor chip 10 and guided to the waveguiding transformer element 22 into the waveguide 24 in a suitable manner. Conversely, the waveguiding transformer element 22 can furthermore be designed to receive microwave signals radiated into the waveguide 24 from outside the semiconductor device 200, which microwave signals can then be guided to the radar semiconductor chip 10. In the context described, the waveguiding transformer element 22 can also be referred to as a "waveguide feed". A connection between the waveguiding transformer element 22 and the radar semiconductor chip 10 can be provided for example at least partly by a coaxial connection running substantially vertically.

The waveguiding transformer element 22 can be embodied for example as an antenna in the form of a structured metal layer on the second surface 6 of the substrate 2. In this case, such an antenna does not necessarily radiate uniformly into space, but rather can be designed to feed the electromagnetic waves generated by the antenna into the waveguide 24 in a suitable manner. One example implementation of such an antenna structure is shown and described in FIG. 10. In this context, the respective waveguiding transformer element 22 can be arranged on the second surface 6 such that the waveguiding transformer element 22 and the volume of the waveguide 24 arranged thereabove at least partly overlap in an orthogonal projection onto the second surface 6 of the substrate 2.

The waveguide component 16 can be embodied in an integral fashion or comprise a plurality of parts. The waveguide component 16 can be produced from plastic, a ceramic material and/or a dielectric material. In the example in FIG. 2, the waveguides 24 can be embodied in the form of hollow waveguides having metallized inner walls for microwave transmission. In further examples, waveguides of semiconductor devices in accordance with the disclosure can alternatively or additionally be embodied in the form of dielectric waveguides (see FIG. 5) or substrate-integrated hollow waveguides (see FIG. 6). In particular, the waveguide component 16 can be embodied in a multilayered injection-molded plastic and the at least one waveguide 24 can comprise a metallized hollow waveguide embodied in the injection-molded plastic. Only hollow waveguides running vertically through the waveguide component 16 are illustrated in the example in FIG. 2. In further examples, the waveguide component 16 can comprise any desired combination of horizontal and vertical hollow waveguide sections connected to one another. One example implementation of a horizontal hollow waveguide in a multilayered injection-molded plastic is shown and described in FIG. 9.

In the example in FIG. 2, the waveguide component 16 can be mounted on the printed circuit board 14 and be connected thereto. In further examples, the waveguide component 16 can likewise be arranged over the printed circuit board 14, but need not necessarily touch the latter. The waveguide component 16 can extend over the second surface 6 and side surfaces of the substrate 2 and thereby at least partly cover or encapsulate the FCBGA 12.

In the example in FIG. 2, an air gap 26 can be formed between the second surface 6 of the substrate 2 and a surface of the waveguide component 16 facing the substrate 2. The air gap can have a height h of less than or equal to $\lambda/10$, wherein $\lambda$ can correspond to a wavelength of signals transmitted in the waveguides 24. The distance h can thus correspond to approximately 500 μm, 400 μm, 300 μm, 200 μm, 100 μm, 50 μm, 20 μm or be smaller. Mechanical stresses between the waveguide component 16 and the FCBGA 12 that possibly occur during operation of the semiconductor device 200 can be prevented or reduced by the air gap 26. In the air gap 26, one or a plurality of structures can be arranged which can be designed to reduce crosstalk of microwave signals transmitted in adjacent waveguides 24 of the waveguide component 16. In particular, the structures can be designed to form standing electromagnetic waves in the air gap 26 between the waveguides 24 and thereby to prevent crosstalk between the waveguides 24. By way of example, suitable structures of this type can comprise $\lambda/4$ structures, wherein $\lambda$ can correspond to a wavelength of signals transmitted in the waveguides 24.

In a further example, the waveguide component 16 can contact the second surface 6 of the substrate 2, with the result that an air gap 26 as illustrated in FIG. 2 need not necessarily be formed. Crosstalk of microwave signals transmitted in the adjacent waveguides 24 can be reduced or prevented as a result. In order to reduce mechanical stresses between the FCBGA 12 and the waveguide component 16 during operation of the semiconductor device 200, for example the coefficients of thermal expansion of the waveguide component 16 and of the FCBGA 12 can be coordinated with one another.

An encapsulation material 80 can be arranged over the first surface 4 of the substrate 2, which encapsulation material 80 can at least partly embed the radar semiconductor chip 10. The radar semiconductor chip 10 can be protected against negative external influences, such as moisture, for example, by the encapsulation material 80. The encapsulation material 80 can include for example at least one from a mold compound, a laminate, an epoxy, a filled epoxy, a glass-fiber-filled epoxy, an imide, a thermoplastic, a thermosetting polymer, or a polymer mixture.

Figure 3:
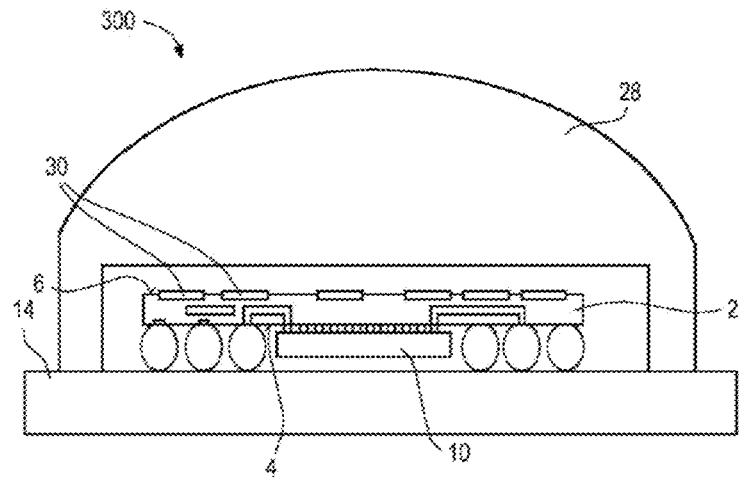
FIG. 3 schematically shows a cross-sectional side view of a semiconductor device 300 in accordance with the disclosure.

FIG. 3 schematically shows a cross-sectional side view of a semiconductor device 300 in accordance with the disclosure. The semiconductor device 300 can be similar to the semiconductor device 200 from FIG. 2 and comprise at least partly identical components. In FIG. 3, the waveguide component 16 having the hollow waveguides 24 from FIG. 2 can be replaced by a dielectric lens 28. Furthermore, the waveguiding transformer elements 22 aligned with the waveguides 24 in FIG. 2 can be replaced by one or a plurality of antennas or radar antennas 30 arranged on the second surface 6 of the substrate 2. The antennas 30 can form an antenna array having a plurality of transmitting and receiving antennas.

The dielectric lens 28 can be designed to focus signals transmitted or received by the semiconductor device 300 or the antennas 30. That is to say that waves emitted into space substantially uniformly by the antennas 30 can be focused into a delimited narrow beam. Conversely, received waves can be focused onto the antennas 30 with the aid of the dielectric lens 28. The shape of the dielectric lens 28 can therefore be coordinated in particular with the arrangement of the antennas 30. The dielectric lens 28 can be produced by employing a 3D printing method, for example. In this case, the dielectric lens 28 can be produced from one or more of the following materials: quartz, polyethylene, acrylonitrile-butadiene-styrene plastic, acrylonitrile-butadiene-styrene-M30 plastic.

Figure 4:
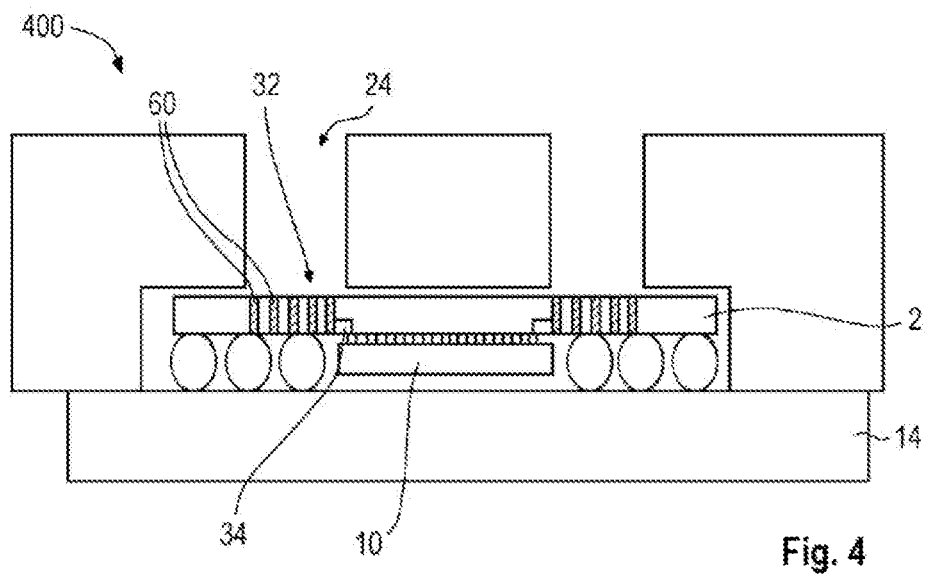
FIG. 4 schematically shows a cross-sectional side view of a semiconductor device 400 in accordance with the disclosure.

FIG. 4 schematically shows a cross-sectional side view of a semiconductor device 400 in accordance with the disclosure. The semiconductor device 400 can be similar to the semiconductor device 200 from FIG. 2 and comprise at least partly identical components. In contrast to FIG. 2, the semiconductor device 400 comprises, instead of the waveguiding transformer element 22, a waveguide transition element 32 integrated into the substrate 2, and an electrical interconnect 34. The waveguide transition element 32 can be designed to feed a radar signal generated by the radar semiconductor chip 10 into the waveguide 24 and vice versa. The electrical interconnect 34 can be designed to electrically couple the waveguide transition element 32 to the radar semiconductor chip 10. One example implementation of the waveguide transition element 32 and of the electrical interconnect 34 is shown and described in FIGS. 8A and 8B.

The waveguide transition element 32 and the electrical interconnect 34 can be designed to convert a transverse electromagnetic mode (TEM mode) of the microwave transmission line that forms the electrical interconnect 34 into a transverse electrical mode (TE mode) of the waveguide 24. As already described above, the waveguide 24 can be aligned with the waveguide transition element 32 in order to provide an effective coupling of a waveguide signal to the waveguide 24. If the waveguide transition element 32 operates as a transmitter, it can for example also be referred to as a launcher, for example a $TE_{01}$ launcher, if it is used to feed the $TE_{10}$ mode into the waveguide 24.

The waveguide transition element 32 can be partly or completely embedded into the substrate 2. In one example, the waveguide transition element 32 can be a prefabricated insert that has been embedded into the substrate 2. In a further example, the waveguide transition element 32 can be produced directly in the substrate 2 after the substrate 2 has been formed. The waveguide transition element 32 can comprise at least one electrically conductive wall structure. In the example in FIG. 4, the electrically conductive wall structure can be an "open structure" comprising at least one metallized via hole 60, for example, which can be embodied either directly in the substrate 2 or in an insert. If the waveguide 24 is embodied as a hollow waveguide, the metallized via holes 60 can be regarded as a continuation of the hollow waveguide into the substrate 2. By way of example, the via holes 60 can be produced into the substrate 2 using laser drilling, and a metallization of the inner walls of the via holes 60 can be produced using conductive paste or metal plating, for example. In a further example, the electrically conductive wall structure can comprise for example a metal lining on a wall of such an insert. In this case, the electrically conductive wall structure can be configured as a grid or network of conductive strips embodied on the side walls of the insert. Furthermore, the conductive wall structure can be embodied as a continuous metal lining on the side walls of the insert.

The electrical interconnect 34 can be partly or completely embedded into the substrate 2. In one example, the electrical interconnect 34 can be embodied as or comprise a hollow waveguide integrated into the substrate 2. In a further example, the electrical interconnect 34 can be embodied as or comprise an electrical redistribution layer, which can be positioned at a lower surface of the substrate 2. One suitable redistribution layer is shown and described in FIGS. 8A and 8B.

Figure 5:
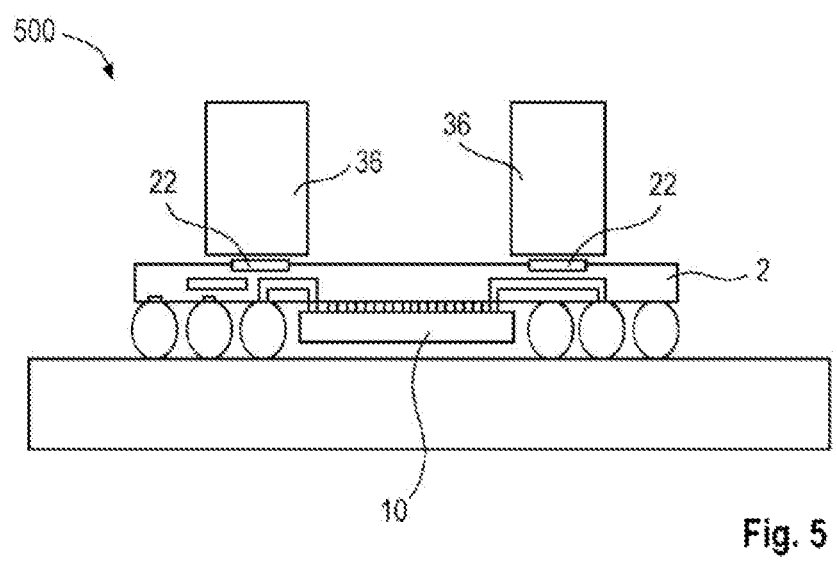
FIG. 5 schematically shows a cross-sectional side view of a semiconductor device 500 in accordance with the disclosure.

FIG. 5 schematically shows a cross-sectional side view of a semiconductor device 500 in accordance with the disclosure. The semiconductor device 500 can be similar to the semiconductor device 200 from FIG. 2 and comprise at least partly identical components. In FIG. 5, the waveguide component 16 having the hollow waveguides 24 from FIG. 2 can be replaced by one or a plurality of dielectric waveguides 36. Each of the dielectric waveguides 36 can be arranged above a waveguiding transformer element 22 and aligned therewith. The dielectric waveguides 36 can be produced for example from plastic materials, in particular from polypropylene, polystyrene and/or polyethylene.

Figure 6:
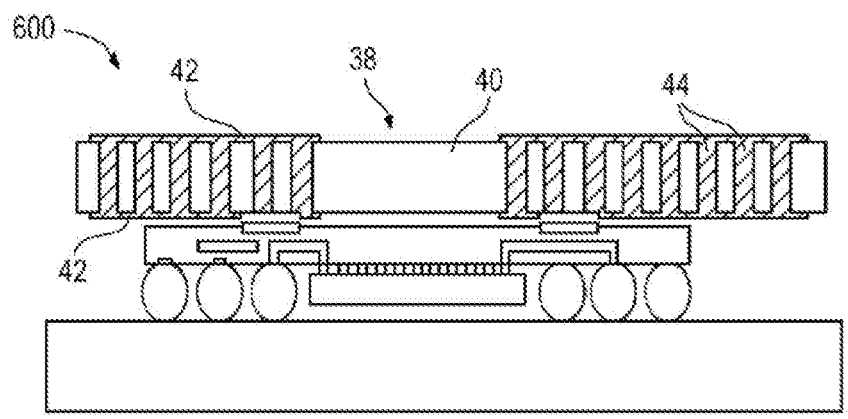
FIG. 6 schematically shows a cross-sectional side view of a semiconductor device 600 in accordance with the disclosure.

FIG. 6 schematically shows a cross-sectional side view of a semiconductor device 600 in accordance with the disclosure. The semiconductor device 600 can be similar to the semiconductor device 200 from FIG. 2 and comprise at least partly identical components. In FIG. 6, the waveguide component 16 having the hollow waveguides 24 from FIG. 2 can be replaced by a substrate-integrated hollow waveguide 38. The substrate-integrated hollow waveguide 38 can comprise a dielectric substrate 40, which can be coated with an electrically conductive material 42, for example a metal, on its top side and underside. The electrically conductive material 42 can be electrically connected by way of electrical plated-through holes 44 running through the dielectric substrate 40. The properties of the substrate-integrated hollow waveguide 38 with regard to its waveguiding functionality are comparable with those of a rectangular waveguide.

Figure 7:
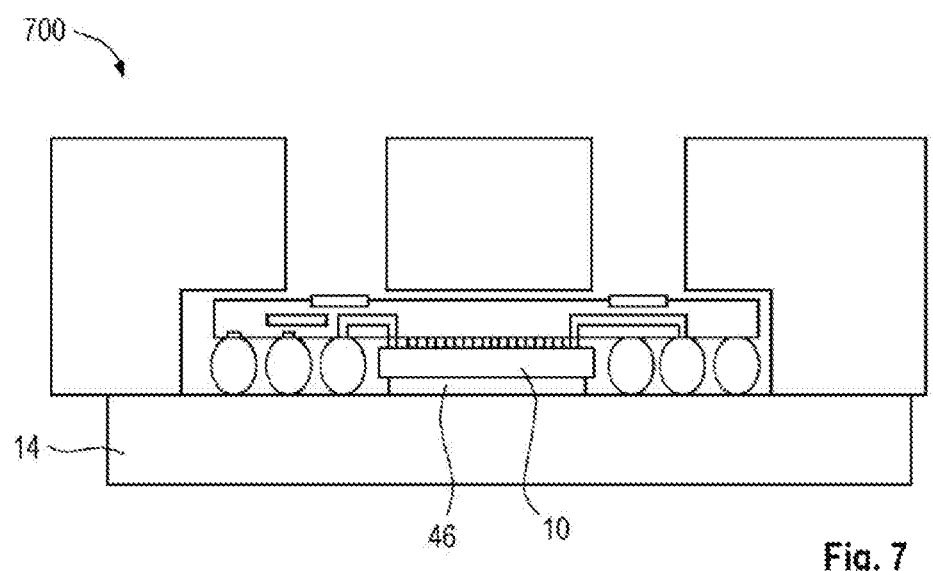
FIG. 7 schematically shows a cross-sectional side view of a semiconductor device 700 in accordance with the disclosure.

FIG. 7 schematically shows a cross-sectional side view of a semiconductor device 700 in accordance with the disclosure. The semiconductor device 700 can be similar to the semiconductor device 200 from FIG. 2 and comprise at least partly identical components. In addition, the semiconductor device 700 can comprise a heat conducting element 46 arranged between the radar semiconductor chip 10 and the printed circuit board 14. In particular, in this case, the heat conducting element 46 can contact the underside of the radar semiconductor chip 10 and/or the top side of the printed circuit board 14. The heat conducting element 46 can be designed to reduce a thermal resistance between the radar semiconductor chip 10 and the printed circuit board 14, such that heat generated by the radar semiconductor chip 10 during operation of the semiconductor device 700 can be dissipated in an improved manner. For this purpose, the printed circuit board 14 can additionally be connected to a heat sink (not illustrated). The heat conducting element 46 can be embodied for example by a thermally conductive paste or a thermally conductive pad.

Figure 8A:
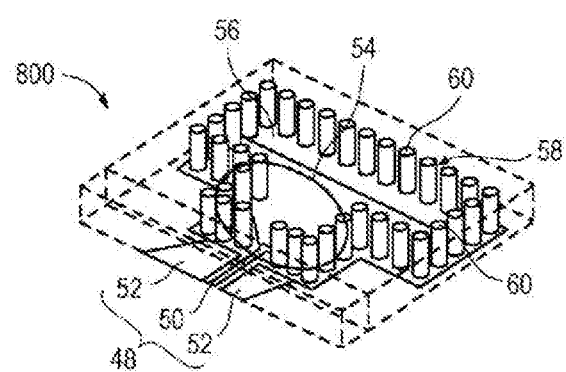
FIGS. 8A and 8B schematically show a perspective view and a plan view of a waveguiding transformer element 800 with an electrical interconnect.
Figure 8B:
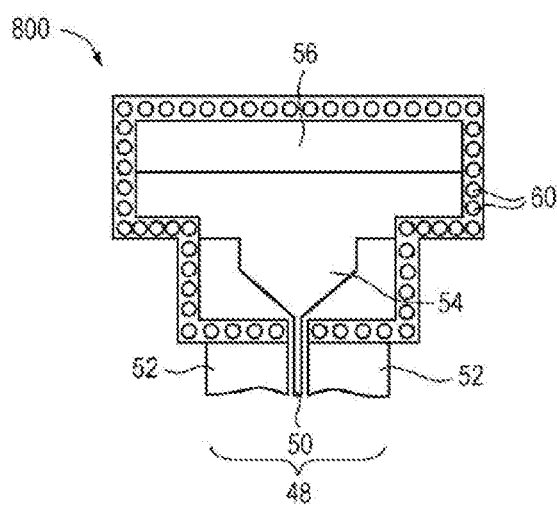

FIGS. 8A and 8B illustrate one example waveguiding transformer element 800, which can be used for example in the semiconductor device 400 in FIG. 4. The waveguiding transformer element 800 can be fed for example by a coplanar microwave transmission line (CTL) 48. The CTL 48 can comprise a central conductor 50 and a pair of return conductors 52, which can be arranged on both sides of the central conductor 50. The CTL 48 can be embodied for example in a redistribution layer of the substrate 2, which layer can be arranged for example on an underside of the substrate 2.

The CTL 48 shown in FIGS. 8A and 8B can represent one example of the electrical interconnect 34 from FIG. 4 or at least one part thereof. In a further example, the electrical interconnect can be embodied by microstrip transmission lines embodied in two different metal layers of a redistribution layer. The waveguiding transformer element 800 can comprise a tapering line structure 54 for a mode transformation. The tapering line structure 54 can be connected to the central conductor 50 and can be embodied as a structured metal layer.

The structured metal layer can form a baseplate of the waveguiding transformer element 800, which at least partly covers the interior of the element. A remaining section of the interior of the waveguiding transformer element 800 can be embodied as an opening 56 in the baseplate. The baseplate with the tapering line structure 54 can furthermore have a framelike structure 58, which can define the side walls of the waveguiding transformer element 800. The electrically conductive side walls can be realized by one or more series of metallized via holes 60. In other examples, the electrically conductive side walls of the waveguiding transformer element 800 can be realized by one or more series of conductive slots or by way of side walls having a continuous metal lining.

The rear-side metal lining, that is to say for example the tapering line structure 54, the framelike structure 58 and the opening 56 can be embodied in each case within a metal layer of a redistribution layer. It should be noted that the tapering line structure 54 is merely one possibility for conversion of a TEM mode into a TE mode or vice versa. Other possibilities are likewise realizable, such as, for example, a single contact hole arranged in the inner side of the waveguiding transformer element 800 and connected to the central conductor 50 for the excitation of the TE waveguide mode.

Figure 9:
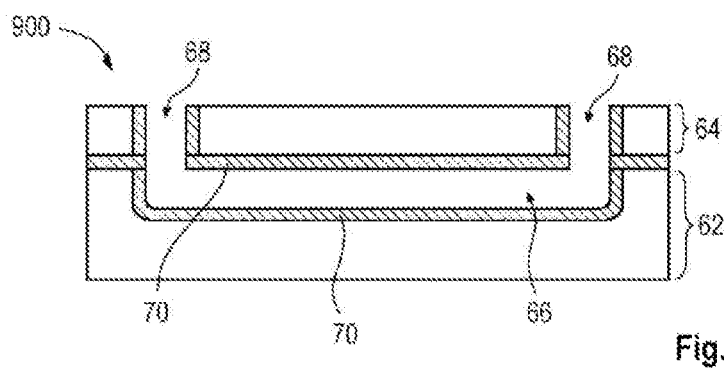
FIG. 9 schematically shows a cross-sectional side view of a multilayered injection-molded plastic 900 with an integrated hollow waveguide.

FIG. 9 schematically shows a cross-sectional side view of a multilayered injection-molded plastic 900 with an integrated hollow waveguide. By way of example, the waveguide component 16 from FIG. 2 can be embodied by a similar injection-molded plastic. The injection-molded plastic 900 can comprise a first layer arrangement 62 and a second layer arrangement 64. Each of the layer arrangements 62 and 64 can comprise one or a plurality of layers, for example layers composed of a ceramic and/or dielectric material. The first layer arrangement 62 can have a cutout 66 running horizontally, while the second layer arrangement 64 can have through holes 68 running vertically through the second layer arrangement 64. The layer arrangements 62 and 64 can be aligned with one another such that the cutout 66 and the through holes 68 form a channel running continuously through the layer arrangements 62 and 64. The inner walls of this channel can be covered by a metallization 70 throughout. The channel with its metallized inner walls can thus form a hollow waveguide through the layer arrangements 62 and 64.

FIG. 9 is intended to illustrate by way of example a substantially horizontal course of a hollow waveguide through a multilayered injection-molded plastic 900. Only part of the injection-molded plastic 900 is illustrated here. The injection-molded plastic 900 can comprise any desired number of further layer arrangements, which can be structured and arranged one above another such that one or a plurality of hollow waveguides having any desired combination of horizontal and vertical sections can extend through the injection-molded plastic 900. Any desired course of the hollow waveguide(s) through the injection-molded plastic 900 can be realized using a suitable combination of horizontal and vertical sections.

Figure 10:
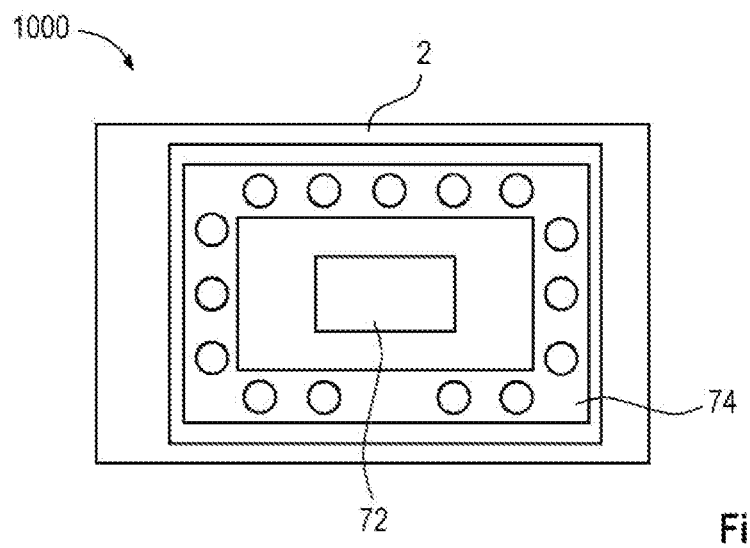
FIG. 10 schematically shows a plan view of a waveguiding transformer element 1000 such as a semiconductor device in accordance with the disclosure may contain.

FIG. 10 schematically shows a plan view of a waveguiding transformer element 1000 such as a semiconductor device in accordance with the disclosure can contain. By way of example, the waveguiding transformer element 22 in FIG. 2 can be embodied in the form of a similar waveguiding transformer element. As already described in FIG. 2, the waveguiding transformer element 1000 can be arranged on a substrate 2. The waveguiding transformer element 1000 can comprise a patch antenna 72, which can be surrounded by a ground structure 74. The patch antenna 72 can be embodied by a rectangular metal surface, for example, and the ground structure 74 can extend around the patch antenna 72 in a rectangular frame shape. The arrangement shown in FIG. 10 can be designed for example to radiate microwave signals originally generated by a radar semiconductor chip 10 and guided to the waveguiding transformer element 22 into a waveguide in a suitable manner.

Figure 11:
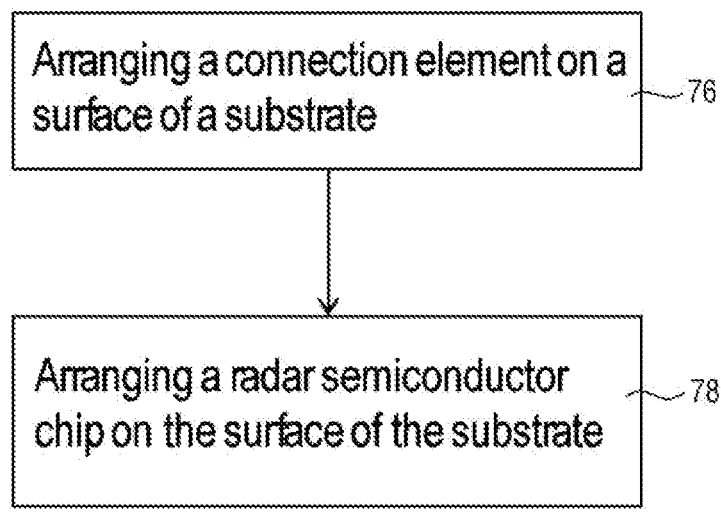
FIG. 11 shows a flow diagram of a method for producing a semiconductor device in accordance with the disclosure.

FIG. 11 shows a flow diagram of a method for producing a semiconductor device in accordance with the disclosure. For example, the semiconductor device 100 from FIG. 1 can be produced by the method. The steps of the method can be carried out, insofar as is technically practical, in any desired order successively or at least partly simultaneously. At 76, at least one connection element is arranged on a first surface of a substrate. The at least one connection element is designed to electrically and mechanically connect the substrate to a printed circuit board. At 78, a radar semiconductor chip is arranged on the first surface of the substrate.

EXAMPLES

Semiconductor devices comprising a radar semiconductor chip and associated production methods are explained below on the basis of examples.

Example 1 is a semiconductor device, comprising: a substrate having a first surface and a second surface opposite the first surface; at least one connection element arranged on the first surface of the substrate and serving for electrically and mechanically connecting the substrate to a printed circuit board; and a radar semiconductor chip arranged on the first surface of the substrate.

Example 2 is a semiconductor device according to example 1, furthermore comprising: at least one radar antenna arranged on the second surface of the substrate, or a waveguiding transformer element arranged on the second surface of the substrate.

Example 3 is a semiconductor device according to example 1 or 2, furthermore comprising: a waveguide transition element integrated into the substrate, wherein the waveguide transition element is designed to feed a radar signal generated by the radar semiconductor chip into a radar waveguide; and an electrical interconnect designed to electrically couple the waveguide transition element to the radar semiconductor chip.

Example 4 is a semiconductor device according to example 3, wherein the waveguide transition element comprises at least one metallized via hole.

Example 5 is a semiconductor device according to example 3 or 4, wherein the electrical interconnect comprises a hollow waveguide integrated into the substrate.

Example 6 is a semiconductor device according to any of examples 3 to 5, wherein the electrical interconnect comprises an electrical redistribution layer of the substrate.

Example 7 is a semiconductor device according to any of the preceding examples, furthermore comprising: a waveguide component arranged over the second surface of the substrate, wherein the waveguide component comprises at least one waveguide.

Example 8 is a semiconductor device according to example 7, wherein the waveguide component extends over the second surface and side surfaces of the substrate.

Example 9 is a semiconductor device according to example 7 or 8, wherein the waveguide component is embodied in a multilayered injection-molded plastic and the at least one waveguide comprises a metallized hollow waveguide embodied in the injection-molded plastic.

Example 10 is a semiconductor device according to any of examples 7 to 9, wherein the at least one waveguide comprises at least one or more from a group consisting of an air-filled hollow waveguide, a dielectric waveguide, and a substrate-integrated hollow waveguide.

Example 11 is a semiconductor device according to any of examples 7 to 10, wherein the volume of the at least one waveguide and the radar antenna or the volume of the at least one waveguide and the waveguiding transformer element at least partly overlap in an orthogonal projection onto the second surface of the substrate.

Example 12 is a semiconductor device according to any of examples 7 to 11, furthermore comprising: an air gap embodied between the second surface of the substrate and a surface of the waveguide component facing the substrate.

Example 13 is a semiconductor device according to example 12, furthermore comprising: at least one structure arranged in the air gap and designed to reduce crosstalk of signals transmitted in adjacent waveguides of the waveguide component.

Example 14 is a semiconductor device according to any of the preceding examples, furthermore comprising: a dielectric lens arranged over the second surface of the substrate and designed to focus signals transmitted or received by the semiconductor device.

Example 15 is a semiconductor device according to any of the preceding examples, wherein the substrate comprises: at least one layer composed of a ceramic or dielectric material; and signal routing structures having plated-through holes and conductor tracks, the signal routing structures being embedded into the at least one layer, wherein the signal routing structures are designed to electrically couple the radar semiconductor chip and the at least one connection element.

Example 16 is a semiconductor device according to any of the preceding examples, furthermore comprising: a heat conducting element arranged between the radar semiconductor chip and the printed circuit board.

Example 17 is a semiconductor device according to any of the preceding examples, furthermore comprising: an encapsulation material arranged over the first surface of the substrate, wherein the radar semiconductor chip is at least partly embedded into the encapsulation material.

Example 18 is a semiconductor device according to any of the preceding examples, wherein the substrate forms a ball grid array substrate, and the radar semiconductor chip is connected to the substrate using flip-chip technology, such that the substrate and the radar semiconductor chip form a flip-chip ball grid array.

Example 19 is a method for producing a semiconductor device, wherein the method comprises: arranging at least one connection element on a first surface of a substrate, wherein the at least one connection element is designed to electrically and mechanically connect the substrate to a printed circuit board; and arranging a radar semiconductor chip on the first surface of the substrate.

Example 20 is a method according to example 19, furthermore comprising: arranging a waveguide component over a second surface of the substrate, wherein the waveguide component comprises at least one waveguide.

Within the meaning of the present description, the terms "connected", "coupled", "electrically connected" and/or "electrically coupled" need not necessarily mean that components must be directly connected or coupled to one another. Intervening components can be present between the "connected", "coupled", "electrically connected" or "electrically coupled" components.

Furthermore, the word "over" used for example with respect to a material layer that is formed "over" a surface of an object or is situated "over" the surface can be used in the present description in the sense that the material layer is arranged (for example formed, deposited, etc.) "directly on", for example in direct contact with, the surface meant. The word "over" used for example with respect to a material layer that is formed or arranged "over" a surface can also be used in the present text in the sense that the material layer is arranged (e.g. formed, deposited, etc.) "indirectly on" the surface meant, wherein for example one or more additional layers are situated between the surface meant and the material layer.

Insofar as the terms "have", "contain", "encompass", "with" or variants thereof are used either in the detailed description or in the claims, these terms are intended to be inclusive in a similar manner to the term "comprise". That means that within the meaning of the present description the terms "have", "contain", "encompass", "with", "comprise" and the like are open terms which indicate the presence of stated elements or features but do not exclude further elements or features. The articles "a/an" or "the" should be understood such that they include the plural meaning and also the singular meaning, unless the context clearly suggests a different understanding.

Furthermore, the word "exemplary" is used in the present text in the sense that it serves as an example, a case or an illustration. An aspect or a design that is described as "exemplary" in the present text should not necessarily be understood in the sense as though it has advantages over other aspects or designs. Rather, the use of the word "exemplary" is intended to present concepts in a concrete manner. Within the meaning of this application, the term "or" does not mean an exclusive "or", but rather an inclusive "or". That is to say that, unless indicated otherwise or unless a different interpretation is allowed by the context, "X uses A or B" means each of the natural inclusive permutations. That is to say if X uses A, X uses B or X uses both A and B, then "X uses A or B" is fulfilled in each of the cases mentioned above. Moreover, the articles "a/an" can be interpreted within the meaning of this application and the accompanying claims generally as "one or more", unless it is expressly stated or clearly evident from the context that only a singular is meant. Furthermore, at least one from A and B or the like generally means A or B or both A and B.

Devices and methods for producing devices are described in the present description. Observations made in connection with a device described can also apply to a corresponding method, and vice versa. If a specific component of a device is described, for example, then a corresponding method for producing the device can contain an action for providing the component in a suitable manner, even if such an action is not explicitly described or illustrated in the figures. Moreover, the features of the various example aspects described in the present text can be combined with one another, unless expressly noted otherwise.

Although the disclosure has been shown and described with respect to one or more implementations, equivalent alterations and modifications based at least in part on the reading and understanding of this description and the accompanying drawings will be apparent to the person skilled in the art. The disclosure includes all such modifications and alterations and is restricted solely by the concept of the following claims. Especially with respect to the various functions that are implemented by the above-described components (for example elements, resources, etc.), the intention is that, unless indicated otherwise, the terms used for describing such components correspond to any components which implement the specified function of the described component (which is functionally equivalent, for example), even if it is not structurally equivalent to the disclosed structure which implements the function of the example implementations of the disclosure as presented herein. Furthermore, even if a specific feature of the disclosure has been disclosed with respect to only one of various implementations, such a feature can be combined with one or more other features of the other implementations in a manner such as is desired and advantageous for a given or specific application.

What is claimed is:

1. A semiconductor device, comprising:
   a substrate having a first surface and a second surface opposite the first surface;
   at least one connection element arranged on the first surface of the substrate to electrically and mechanically connect the substrate to a printed circuit board;
   a radar semiconductor chip arranged on the first surface of the substrate; and
   at least one of:
      a waveguiding transformer element comprising a first surface and a second surface, wherein the first surface of the waveguiding transformer element resides above the first surface of the substrate, and wherein the second surface of the waveguiding transformer element is embedded into the substrate,
      a radar antenna at least partially embedded into the substrate, or
      a waveguide transition element embedded into the substrate, wherein the first surface of the substrate exposes a first end of the waveguiding transformer element, wherein the second surface of the substrate exposes a second end of the waveguiding transformer element.

2. The semiconductor device as claimed in claim 1, further comprising:
   the radar antenna at least partially embedded into the substrate.

3. The semiconductor device as claimed in claim 1, wherein the waveguide transition element is designed to feed a radar signal generated by the radar semiconductor chip into a radar waveguide and the semiconductor device further comprising:
an electrical interconnect designed to electrically couple the waveguide transition element to the radar semiconductor chip.

4. The semiconductor device as claimed in claim 1, wherein the waveguide transition element comprises at least one metallized via hole.

5. The semiconductor device as claimed in claim 3, wherein the electrical interconnect comprises a hollow waveguide integrated into the substrate.

6. The semiconductor device as claimed in claim 3, wherein the electrical interconnect comprises an electrical redistribution layer of the substrate.

7. The semiconductor device as claimed in claim 1, further comprising:
a waveguide component arranged over the second surface of the substrate, wherein the waveguide component comprises at least one waveguide.

8. The semiconductor device as claimed in claim 7, wherein the waveguide component extends over the second surface of the substrate and side surfaces of the substrate.

9. The semiconductor device as claimed in claim 7, wherein the waveguide component is embodied in a multi-layered injection-molded plastic and the at least one waveguide comprises a metallized hollow waveguide embodied in the injection-molded plastic.

10. The semiconductor device as claimed in claim 7, wherein the at least one waveguide comprises at least one or more from a group consisting of an air-filled hollow waveguide, a dielectric waveguide, and a substrate-integrated hollow waveguide.

11. The semiconductor device as claimed in claim 1, wherein the waveguiding transformer element comprises at least one waveguide, wherein a volume of the at least one waveguide and the radar antenna or a volume of the at least one waveguide and the waveguiding transformer element at least partly overlap in an orthogonal projection onto the second surface of the substrate.

12. The semiconductor device as claimed in claim 7, further comprising:
an air gap embodied between the second surface of the substrate and a surface of the waveguide component facing the substrate.

13. The semiconductor device as claimed in claim 12, further comprising:
at least one structure arranged in the air gap and designed to reduce crosstalk of signals transmitted in adjacent waveguides of the waveguide component.

14. The semiconductor device as claimed in claim 1, further comprising:
a dielectric lens arranged over the second surface of the substrate and designed to focus signals transmitted or received by the semiconductor device.

15. The semiconductor device as claimed in claim 1, wherein the substrate comprises:
at least one layer composed of a ceramic or dielectric material; and
signal routing structures having plated-through holes and conductor tracks, the signal routing structures being embedded into the at least one layer, wherein the signal routing structures are designed to electrically couple the radar semiconductor chip and the at least one connection element.

16. The semiconductor device as claimed in claim 1, further comprising:
a heat conducting element arranged between the radar semiconductor chip and the printed circuit board.

17. The semiconductor device as claimed in claim 1, further comprising:
an encapsulation material arranged over the first surface of the substrate, wherein the radar semiconductor chip is at least partly embedded into the encapsulation material.

18. The semiconductor device as claimed in claim 1, wherein
the substrate forms a ball grid array substrate, and
the radar semiconductor chip is connected to the substrate using flip-chip technology, such that the substrate and the radar semiconductor chip form a flip-chip ball grid array.

19. A method for producing a semiconductor device, wherein the method comprises:
arranging at least one connection element on a first surface of a substrate, wherein the at least one connection element is designed to electrically and mechanically connect the substrate to a printed circuit board;
embedding a portion of a waveguiding transformer element into the substrate, wherein a first surface of the waveguiding transformer element resides above the first surface of the substrate, and wherein a second surface of the waveguiding transformer element is embedded into the substrate; and
arranging a radar semiconductor chip on the first surface of the substrate, wherein the first surface of the substrate exposes a first end of the waveguiding transformer element, and wherein a second surface of the substrate, opposite of the first surface, exposes a second end of the waveguiding transformer element.

20. The method as claimed in claim 19, further comprising:
arranging a waveguide component over the second surface of the substrate, wherein the waveguide component comprises at least one waveguide.

* * * * *